United States Patent
Gong et al.

(10) Patent No.: US 12,207,496 B2
(45) Date of Patent: Jan. 21, 2025

(54) DISPLAY APPARATUS

(71) Applicant: LG Display Co., Ltd., Seoul (KR)

(72) Inventors: Hye-Jin Gong, Paju-si (KR); Pureum Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 529 days.

(21) Appl. No.: 17/559,589

(22) Filed: Dec. 22, 2021

(65) Prior Publication Data
US 2022/0209206 A1  Jun. 30, 2022

(30) Foreign Application Priority Data
Dec. 31, 2020  (KR) ........................ 10-2020-0189673

(51) Int. Cl.
| | |
|---|---|
| *H10K 50/86* | (2023.01) |
| *H10K 50/844* | (2023.01) |
| *H10K 59/122* | (2023.01) |
| *H10K 59/38* | (2023.01) |

(52) U.S. Cl.
CPC ......... *H10K 50/865* (2023.02); *H10K 50/844* (2023.02); *H10K 59/122* (2023.02); *H10K 59/38* (2023.02)

(58) Field of Classification Search
CPC .. H10K 50/865; H10K 50/844; H10K 59/122; H10K 59/38; H10K 59/873; H10K 59/8792; H10K 50/19; H10K 59/124; H10K 59/878; H10K 59/353; H10K 59/35
See application file for complete search history.

(56) References Cited

U.S. PATENT DOCUMENTS

| | | | | |
|---|---|---|---|---|
| 10,483,335 B2* | 11/2019 | Bang | ...................... | H10K 50/13 |
| 10,756,154 B2* | 8/2020 | Kim | ...................... | H10K 59/122 |
| 10,896,939 B2* | 1/2021 | Jeon | ...................... | H10K 59/122 |
| 2016/0322444 A1* | 11/2016 | Kang | ...................... | H10K 59/122 |
| 2019/0379006 A1* | 12/2019 | Lim | ...................... | G06F 1/163 |
| 2020/0105854 A1* | 4/2020 | Kim | ...................... | H10K 50/865 |
| 2020/0127056 A1* | 4/2020 | Guo | ...................... | H10K 71/00 |
| 2020/0287167 A1* | 9/2020 | Tian | ...................... | H10K 50/865 |
| 2020/0343314 A1* | 10/2020 | Nakamura | ............ | G06F 1/1698 |

FOREIGN PATENT DOCUMENTS

| | | |
|---|---|---|
| KR | 10-2019-0140348 A | 12/2019 |
| KR | 10-2020-0013884 A | 2/2020 |
| KR | 10-2020-0014199 A | 2/2020 |
| KR | 10-2020-0069769 A | 6/2020 |

* cited by examiner

*Primary Examiner* — S M Sohel Imtiaz
(74) *Attorney, Agent, or Firm* — Birch, Stewart, Kolasch & Birch, LLP

(57) ABSTRACT

Discussed is a display apparatus including a substrate having a plurality of subpixels with a first subpixel and a second subpixel, an insulating layer having a trench on the substrate, a first electrode provided in each of the first and second subpixels on the insulating layer, a light emitting layer provided on the insulating layer and the first electrode, a second electrode provided on the light emitting layer, an encapsulation layer provided on the second electrode, and a light absorption layer provided in a region overlapping the trench. The trench and the light absorption layer can be provided in a boundary region between the first subpixel and the second subpixel.

15 Claims, 9 Drawing Sheets

DISPLAY APPARATUS

CROSS-REFERENCE TO RELATED APPLICATIONS

This application claims the priority benefit of the Korean Patent Application No. 10-2020-0189673 filed in the Republic of Korea on Dec. 31, 2020, the entire contents of which are hereby expressly incorporated by reference as if fully set forth herein into the present application.

BACKGROUND

Field of the Invention

The present disclosure relates to a display apparatus.

Discussion of the Background Art

With the development of the information society, demand for display apparatuses for displaying an image has increased in various forms. Accordingly, various display apparatuses such as liquid crystal displays (LCDs), plasma display panels (PDPs), and organic light emitting displays (OLEDs) have recently been used.

Among the display apparatuses, an organic light emitting display apparatus is a self-luminous type display apparatus, which has superior viewing angle and contrast ratio compared to an LCD, is lightweight and thin because it does not require a separate backlight, and is advantageous in power consumption. In addition, the organic light emitting display apparatus can be driven with a low DC voltage, can have a fast response speed, and can incur low manufacturing costs.

Meanwhile, in a plurality of pixels of an organic light emitting display, a lateral leakage current (LLC) can flow between neighboring pixels to deteriorate display quality.

SUMMARY OF THE DISCLOSURE

Accordingly, the present disclosure is directed to providing a display apparatus that substantially obviates one or more problems due to limitations and disadvantages of the related art.

An aspect of the present disclosure is directed to providing a display apparatus in which an encapsulation layer is stably provided and color mixing between adjacent subpixels is prevented, while preventing a flow of lateral leakage current.

Additional advantages and features of the disclosure will be set forth in part in the description which follows and in part will become apparent to those having ordinary skill in the art upon examination of the following or can be learned from practice of the disclosure. The objectives and other advantages of the disclosure can be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate having a plurality of subpixels with a first subpixel and a second subpixel, an insulating layer including a trench on the substrate, a first electrode provided in each of the first and second subpixels on the insulating layer, a light emitting layer provided on the insulating layer and the first electrode, a second electrode provided on the light emitting layer, an encapsulation layer provided on the second electrode, and a light absorption layer provided in a region overlapping the trench, wherein the trench and the light absorption layer are provided in a boundary region between the first subpixel and the second subpixel.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE EMBODIMENTS

Figure 1:
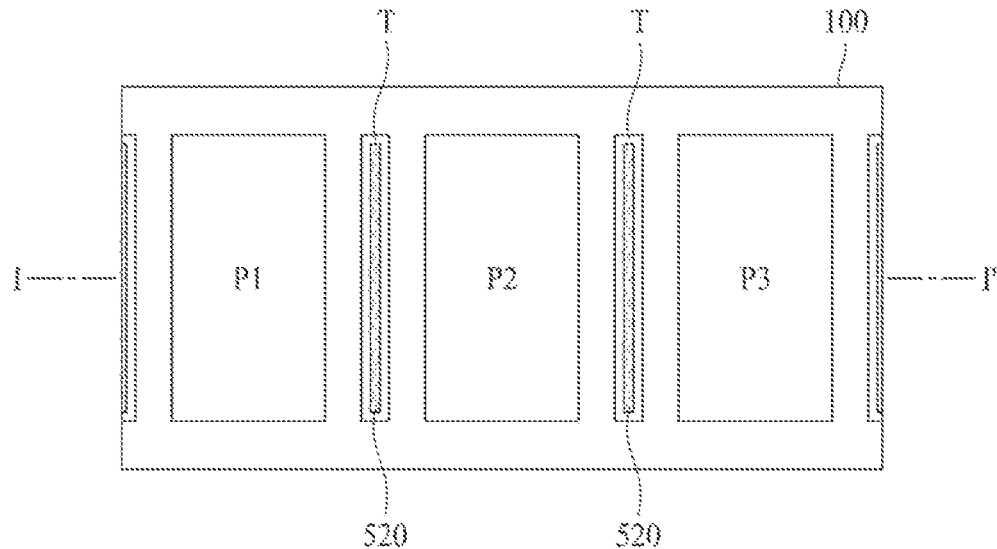
FIG. 1 is a schematic plan view illustrating an example of a display apparatus according to the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only~' is used. The terms of a singular form can include plural forms unless referred to the contrary.

In construing an element, the element is construed as including an error range although there is no explicit description.

In describing a position relationship, e.g., when a position relation between two parts is described as 'on~', 'over~', 'under~', and 'next~', one or more other parts can be disposed between the two parts unless 'just' or 'direct' is used.

In describing a time relationship, e.g., when the temporal order is described as 'after~', 'subsequent~', 'next~', and 'before~', a case which is not continuous can be included unless 'just' or 'direct' is used.

It will be understood that, although the terms "first", "second", etc. Can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers can be present. Also, it should be understood that when one element is disposed on or under another element, this can denote a case where the elements are disposed to directly contact each other, but can denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, embodiments of the present disclosure will be described in detail with reference to the accompanying drawings.

FIG. 1 is a schematic plan view illustrating an example of a display apparatus according to the present disclosure. All the components of each display apparatus according to all examples and embodiments of the present disclosure.

As can be seen from FIG. 1, the display apparatus according to an embodiment of the present disclosure includes a substrate 100, first to third subpixels P1 to P3, a plurality of trenches T, and a light absorption layer 520.

A plurality of subpixels can be provided on the substrate 100. The plurality of subpixels can include the first subpixel P1, the second subpixel P2, and the third subpixel SP3 arranged in a first direction, e.g., in a horizontal direction, but not necessarily limited thereto.

The first subpixel P1 can be provided to emit light of a first color, e.g., red light, the second subpixel P2 can be provided to emit light of a second color, e.g., green light, and the third subpixel P3 can be provided to emit light of a third color, e.g., blue light, but are not limited thereto. The arrangement structure of the plurality of subpixels including the first to third subpixels P1, P2, and P3 can be changed to various structures known in the art.

The trench T is provided in a boundary region between two adjacent subpixels among the subpixels P1 to P3. For example, one trench T is formed in a boundary region between the first subpixel P1 and the second subpixel P2, and another trench T is formed in a boundary region between the second subpixel P2 and the third subpixel P3.

The light absorption layer 520 can be provided in a region overlapping the trench T and can absorb light. In addition, a width of the light absorption layer 520 can be greater or smaller than a width of the trench T, but does not extend to a region in which the first to third subpixels P1 to P3 are provided.

Hereinafter, an electroluminescent display apparatus according to various embodiments of the present disclosure will be described with reference to a cross-sectional view. All the components of each electroluminescent display apparatus according to all embodiments of the present disclosure are operatively coupled and configured.

Figure 2:
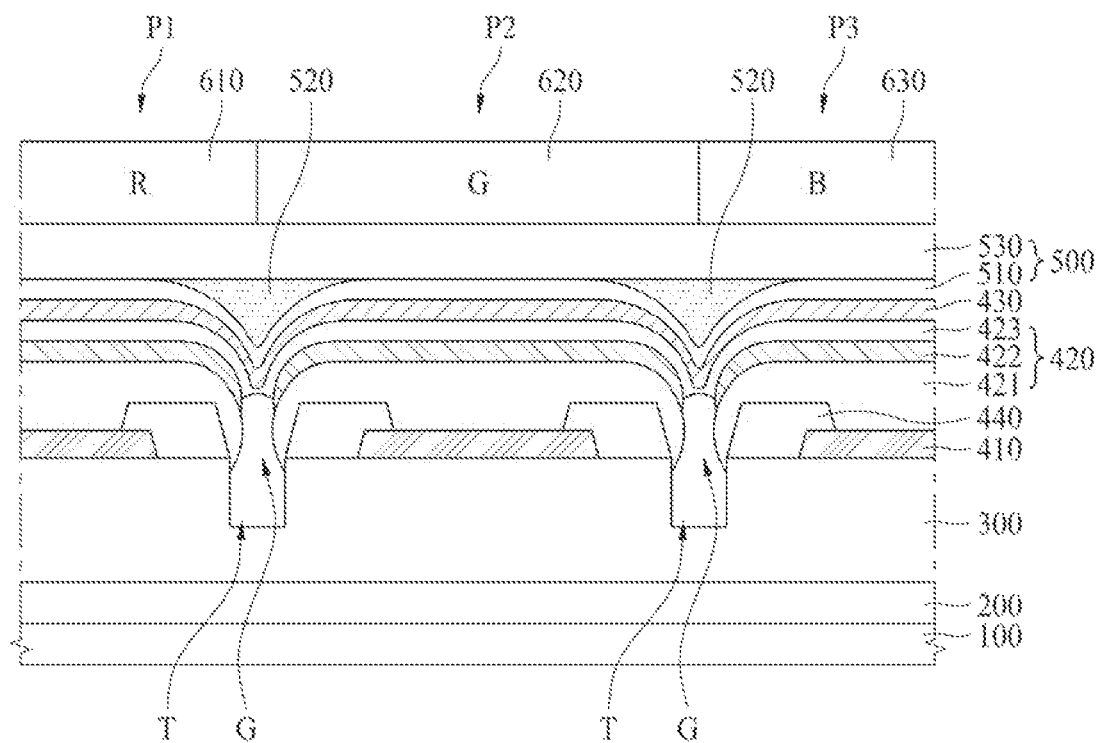
FIG. 2 is a schematic cross-sectional view illustrating an example of a display apparatus according to the present disclosure.

FIG. 2 is a schematic cross-sectional view of a display apparatus according to an embodiment of the present disclosure, which corresponds to a cross-section taken along line I-I' in FIG. 1.

As can be seen from FIG. 2, the display apparatus according to an embodiment of the present disclosure includes a substrate 100, a circuit element layer 200, an insulating layer 300, a first electrode 410, a light emitting layer 420, a second electrode 430, a bank 440, an encapsulation layer 500, a light absorption layer 520, and first to third color filters 610, 620, and 630.

The substrate 100 can be formed of glass or plastic, but is not limited thereto, and can be formed of a semiconductor material such as a silicon wafer. The first to third subpixels P1 to P3 are provided on the substrate 100.

The display apparatus according to an embodiment of the present disclosure can be formed in a so-called top emission mode in which emitted light is emitted upward. Accordingly, as a material of the substrate 100, not only a transparent material but also an opaque material can be used.

The circuit element layer 200 is formed on the substrate 100. In the circuit element layer 200, circuit elements including various signal lines, thin film transistors (TFTs), and capacitors are provided for each subpixel P1 to P3. The signal lines can include a gate line, a data line, a power line, and a reference line, and the TFT can include a switching TFT, a driving TFT, and a sensing TFT.

The switching TFT is switched according to a gate signal supplied to the gate line and serves to supply a data voltage supplied from the data line to the driving TFT.

The driving TFT is switched according to a data voltage supplied from the switching TFT to generate a data current from power supplied from the power line and supply the generated data current to the first electrode 410.

The sensing TFT serves to sense a threshold voltage deviation of the driving TFT that causes image quality degradation, and in response to a sensing control signal supplied from the gate line or a separate sensing line, the sensing TFT supplies a current from the driving TFT to the reference line.

The capacitor serves to maintain a data voltage supplied to the driving TFT for one frame and is connected to a gate terminal and a source terminal of the driving TFT.

The insulating layer 300 is formed on the circuit element layer 200. The insulating layer 300 can be formed of an organic film such as acrylic resin, epoxy resin, phenolic resin, polyamide resin, polyimide resin, etc. Alternatively, the insulating layer 300 can be formed of an inorganic layer such as silicon nitride, aluminum nitride, zirconium nitride, titanium nitride, hafnium nitride, tantalum nitride, silicon oxide, aluminum oxide, or titanium oxide.

In a boundary region between the first subpixel P1 and the second subpixel P2 and a boundary region between the second subpixel P2 and the third subpixel P3, the trench T is provided in the insulating layer 300. The trench T is provided in a region between the bank 440 covering the end of the first electrode 410 of the first subpixel P1 and the bank 440 covering the end of the first electrode 410 of the second subpixel P2, and a region between the bank 440 covering the end of the first electrode 410 of the second subpixel P2 and the bank 440 covering the end of the first electrode 410 of the third subpixel P3 and can extend to a certain region inside the insulating layer 300 without penetrating through the insulating layer 300. However, the present disclosure is not necessarily limited thereto, and the trench T can penetrate through the insulating layer 300 and can extend to a certain region inside the circuit element layer 200 therebelow.

The bank 440 is formed in a matrix structure in the boundary region between the adjacent subpixels P1 to P3. In addition, one end of the bank 440 can be provided to be in contact with an entrance of the trench T, or can be spaced apart from the entrance of the trench T by a predetermined distance.

Also, the bank 440 can be formed to cover both ends of the first electrode 410 provided in the first to third subpixels P1 to P3. Accordingly, an exposed area of the first electrode 410 not covered by the bank 440 is a light emitting region.

In addition, the bank 440 can be formed to cover a portion of an upper surface and a side surface of the end of the first electrode 410, thereby preventing the problem that current is concentrated on the end of the first electrode 410 and luminous efficiency is lowered. Further, the bank 440 can be formed of an inorganic insulating layer, but is not limited thereto, and can be formed of an organic insulating layer.

The light emitting layer 420 is formed on the insulating layer 300, the bank 440, and the first electrode 410. For example, the light emitting layer 420 is formed in the first to third subpixels P1 to P3 and the boundary regions between the adjacent subpixels P1 to P3.

The light emitting layer 420 can be provided to emit white W light. To this end, the light emitting layer 420 can include a plurality of stacks that emit light of different colors. Specifically, the light emitting layer 420 can include a first stack 421, a second stack 423, and a charge generating layer CGL 422 provided between the first stack 421 and the second stack 423.

The first stack 421 can include a hole injection layer, a first hole transport layer, a first organic light emitting layer, and a first electron transport layer being sequentially stacked, the second stack 423 can include a second hole transport layer, a second organic light emitting layer, a second electron transport layer, and an electron injection layer being sequentially stacked, and the charge generating layer 422 can include an N-type charge generating layer for supplying electrons to the first stack 421 and a P-type charge generating layer for supplying holes to the second stack 423.

The light emitting layer 420 is formed inside and above the trench T. When the light emitting layer 420 is formed inside the trench T, at least a portion of the light emitting layer 420 can be disconnected, thereby preventing a leakage current between the adjacent subpixels P1 to P3.

Specifically, the first stack 421 can be formed on a side surface and a lower surface in the trench T. In this case, the first stack 421 can be disconnected without being continuous in the trench T. Accordingly, charges cannot move through the first stack 421 between the first and second subpixels P1 and P2 and between the second and third subpixels P2 and P3 disposed to be adjacent to each other with the trench T therebetween.

The charge generating layer 422 is provided on the first stack 421. In this case, the charge generating layer 422 can be disconnected from the inside of the trench T or in a region overlapping the trench T. Accordingly, charges cannot move through the charge generating layer 422 between the first and second subpixels P1 and P2 and between the second and third subpixels P2 and P3 disposed adjacent to each other with the trench T therebetween.

At least a portion of the second stack 423 can be disconnected and at least a portion thereof can be continuous between the first subpixel P1 and the second subpixel P2 and between the second subpixel P2 and the third subpixel P3 disposed to be adjacent with the trench T therebetween on the charge generating layer 422. As described above, since the second stack 423 includes the second hole transport layer, the second organic light emitting layer, the second electron transport layer, and the electron injection layer being sequentially stacked, the second hole transport layer and the second organic light emitting layer can be disconnected and the second electron transport layer and the electron injection layer can be continuous. Alternatively, the second hole transport layer, the second organic light emitting layer, and the second electron transport layer can be disconnected, and the electron injection layer can be continuous. Accordingly, charges can move through the second stack 423 between the first and second subpixels P1 and P2 and between the second and third subpixels P2 and P3 disposed to be adjacent to each other with the trench T therebetween.

As described above, in the boundary region between the two adjacent subpixels P1 to P3, at least a portion of the second stack 423 is disconnected and the remaining portion is continuous, so that a thickness of the second stack 423 overlapping the trench T region can be smaller than a thickness of the second stack 423 that does not overlap the trench T region.

Due to the structure of the first stack 421, the charge generating layer 422, and the second stack 423 described above, a gap G is provided in the light emitting layer 420. Specifically, the gap G can be provided inside the trench T and can extend to an upper portion of the trench T. In this case, the end of the gap G is formed at a position higher than the charge generating layer 422, so that the charge generating layer 422 can be disconnected on the trench T by the gap G. In addition, a width of the gap G can be formed to decrease from the bottom to the top of the gap G.

The second electrode 430 is provided on the second stack 423. The second electrode 430 can function as a cathode of the display apparatus. Like the light emitting layer 420, the second electrode 430 is formed in all of the subpixels P1 to P3 and the boundary regions between the subpixels P1 to P3.

Since an upper surface of the second stack 423 is not disconnected, the second electrode 430 can be stably deposited on the light emitting layer 420 and a portion overlapping the trench T region can have a concave shape.

Since the display apparatus according to an embodiment of the present disclosure is formed in a top emission mode, the second electrode 430 can be formed of a transparent metal material such as indium tin oxide (ITO) or indium zinc oxide (IZO) so that light emitted from the light emitting layer 420 can be transmitted upward. In addition, the second electrode 430 can be formed of a single layer or multiple layers.

The encapsulation layer 500 is provided on the second electrode 430. The encapsulation layer 500 can include a first encapsulation layer 510 and a second encapsulation layer 530. In addition, a light absorption layer 520 is provided inside the encapsulation layer 500.

The first encapsulation layer 510 is formed to cover the second electrode 430. In addition, the first encapsulation layer 510 is formed of an inorganic material, an organic material, or a mixture of an inorganic material and an organic material, and can be configured as a single layer or multiple layers. In addition, in order to improve adhesion between the light absorption layer 520 formed of an inorganic material and the first encapsulation layer 510, the uppermost material of the first encapsulation layer 510 can be formed of an inorganic material such as silicon nitride or aluminum oxide.

The light absorption layer 520 can be provided on the first encapsulation layer 510 and can be formed of a material that absorbs light. For example, the light absorption layer 520 can be formed of an inorganic material such as an epoxy-based compound or an acrylic compound.

The light absorption layer 520 is formed in a position overlapping the trench T on the first encapsulation layer 510. Specifically, since the first encapsulation layer 510 is formed to cover an upper surface of the second electrode 430, it has a concave shape in the region overlapping the trench T, and the light absorption layer 520 is formed to fill a concave region of the first encapsulation layer 510. Accordingly, a step difference due to the trench T can be compensated for by the light absorption layer 520 so that upper surfaces of the first encapsulation layer 510 and the light absorption layer 520 can be formed to be flat.

The second encapsulation layer 530 is formed on the first encapsulation layer 510 and the light absorption layer 520. For example, the second encapsulation layer 530 can contact the light absorption layer 520 in a region overlapping the trench T and can contact the first encapsulation layer 510 in a region overlapping the first electrode 410. The second encapsulation layer 530 can be formed of an inorganic material, an organic material, or a mixture of an inorganic material and an organic material, and can be configured as a single layer or a multilayer. Since upper surfaces of the first encapsulation layer 510 and the light absorption layer 520 are flat, the second encapsulation layer 530 can be stably formed.

Since the uppermost surface of the first encapsulation layer 510 and the light absorption layer 520 are formed of an inorganic material, a lower surface of the second encapsulation layer 530 can include an inorganic material such as silicon nitride or aluminum oxide to strength adhesion between the first encapsulation layer 510 and the light absorption layer 520 and the second encapsulation layer 530.

The color filters 610, 620, and 630 are provided on the second encapsulation layer 530. The color filters 610, 620, and 630 include a red (R) first color filter 610 provided in the first subpixel P1, a green (G) second color filter 620 provided in the second subpixel P2, and a blue (B) third color filter 630 provided in the third subpixel P3. Accordingly, in the first subpixel P1, only the red (R) light is transmitted while white (W) light emitted from the light emitting layer 420 passes through the red (R) first color filter 610, and in the second subpixel P2, only green (G) light is transmitted while white (W) light emitted from the light emitting layer 420 passes through the green (G) second color filter 620. Also, in the third subpixel P3, only blue (B) light is transmitted while white (W) light emitted from the light emitting layer 420 passes through the blue (B) third color filter 630.

In this case, the light absorption layer 520 can be positioned in the boundary region of the color filters 610, 620, and 630 adjacent to each other to prevent color mixing of the light emitted from each of the subpixels P1 to P3.

A protective film can be additionally provided on the color filters 610, 620, and 630.

As a result, in the present disclosure, by disconnecting the charge generating layer 422 in the boundary region between the adjacent subpixels P1 to P3 through the trench T provided in the light emitting layer 420, an occurrence of a lateral leakage current flowing in the boundary region between the adjacent subpixels P1 to P3 can be prevented. Specifically, the charge generating layer 422 has conductivity higher than the first stack 421 and the second stack 423. In particular, since the N-type charge generating layer constituting the charge generating layer 422 can include a metal material, conductivity thereof is higher than that of the first stack 421 and the second stack 423. For example, charges between the subpixels P1 to P3 disposed adjacent to each other can be mainly transferred through the charge generating layer 422, and the amount of transfer of charges through the second stack 423 is insignificant. Therefore, by forming the charge generating layer 422 to be disconnected inside the trench T, the transfer of charges between the subpixels P1 to P3 disposed adjacent to each other can be reduced to thereby prevent an occurrence of a leakage current.

In addition, by providing the light absorption layer 520 in the region overlapping the trench T, a step difference of the first encapsulation layer 510 can be compensated, so that upper surfaces of the first encapsulation layer 510 and the light absorption layer 520 can be formed to be flat, thereby stably forming the second encapsulation layer 530 and the color filters 610, 620, and 630. In addition, since the light absorption layer 520 is formed in a boundary region between the adjacent color filters 610, 620, and 630, color mixing of the light emitted from each of the subpixels P1 to P3 can be prevented.

FIGS. 3A to 3F are cross-sectional views illustrating a process of forming a display apparatus according to an embodiment of the present disclosure.

Figure 3A:
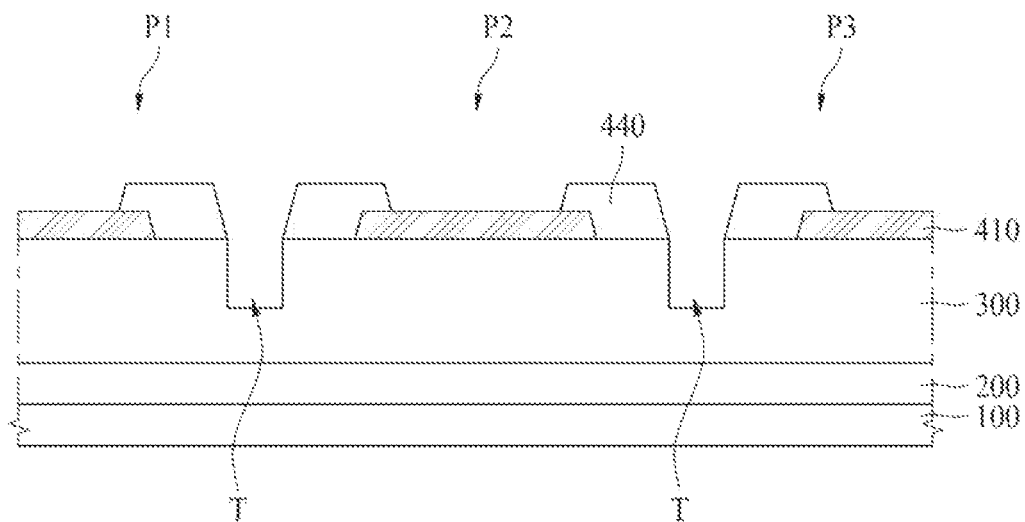
FIGS. 3A to 3F are cross-sectional views illustrating a process of forming a display apparatus according to an embodiment of the present disclosure.

Referring to FIG. 3A, the circuit element layer 200 is formed on the substrate 100, and the insulating layer 300 is formed on the circuit element layer 200. The first electrode 410 is formed on the insulating layer 300, the trench T is formed in the insulating layer 300, and the bank 440 is formed on the insulating layer 300 and the first electrode 410.

The first electrode 410 is formed on the insulating layer 300 by patterning the first to third subpixels P1 to P3. Also, the trench T is formed by etching the insulating layer 300 in the region between the first and second subpixels P1 and P2 and in the region between the second and third subpixels P2 and P3. And, as described above, the bank 440 is formed to cover both ends of the first electrode 410 on the insulating layer 300.

Figure 3B:
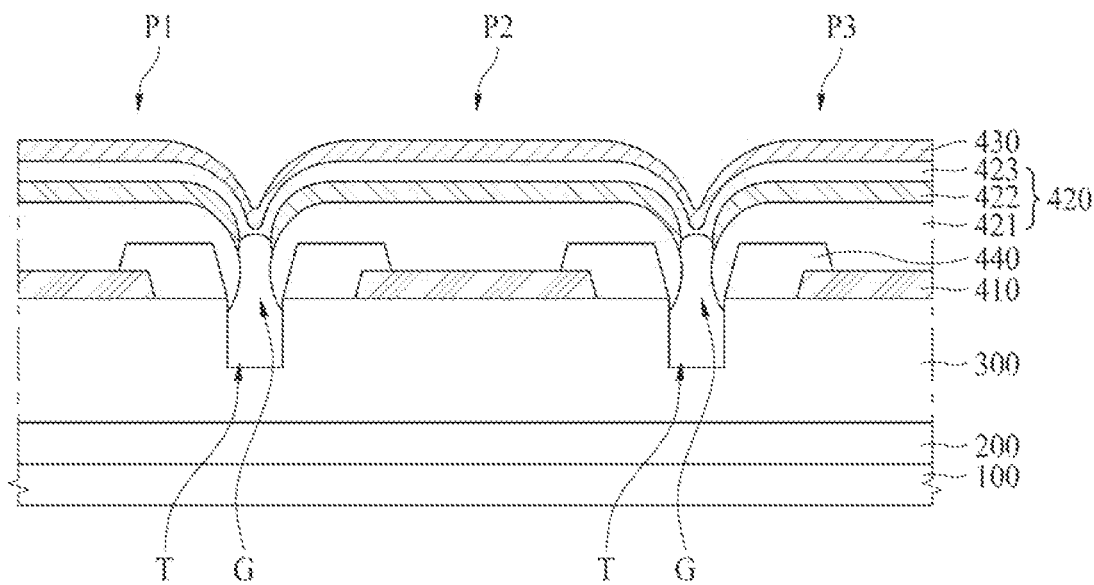

Referring to FIG. 3B, the light emitting layer 420 is formed on the insulating layer 300, the bank 440, and the first electrode 410. For example, the first stack 421, the charge generating layer 422, and the second stack 423 can be sequentially deposited on the insulating layer 300, the bank 440, and the first electrode 410 to form the light emitting layer 420. Also, the second electrode 430 is formed on the light emitting layer 420.

The light emitting layer 420 can be formed to cover the inner side and lower surfaces of the trench T. As described above, the first stack 421 can be discontinuous and disconnected within the trench T, and the charge generating layer 422 can be discontinuous and disconnected within the trench T or above the trench T. Also, the second stack 423 can be continuous above the trench T, but a portion of the second stack 423 can be disconnected above the trench T. Accordingly, a gap G is formed in the light emitting layer 420 in the region overlapping the trench T.

Figure 3C:
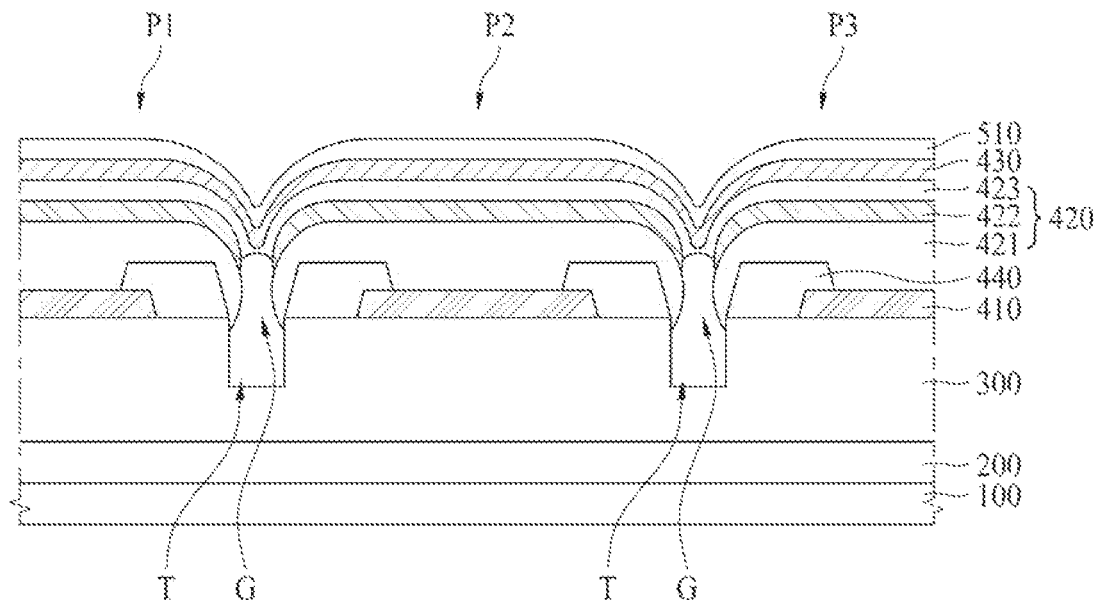

Referring to FIG. 3C, a first encapsulation layer 510 is formed on the second electrode 430. The first encapsulation layer 510 can be formed to cover the second electrode 430 and can have a concave shape in a region overlapping the trench T. Also, as described above, the uppermost material of the first encapsulation layer 510 can be formed of an inorganic material such as silicon nitride or aluminum oxide.

Figure 3D:
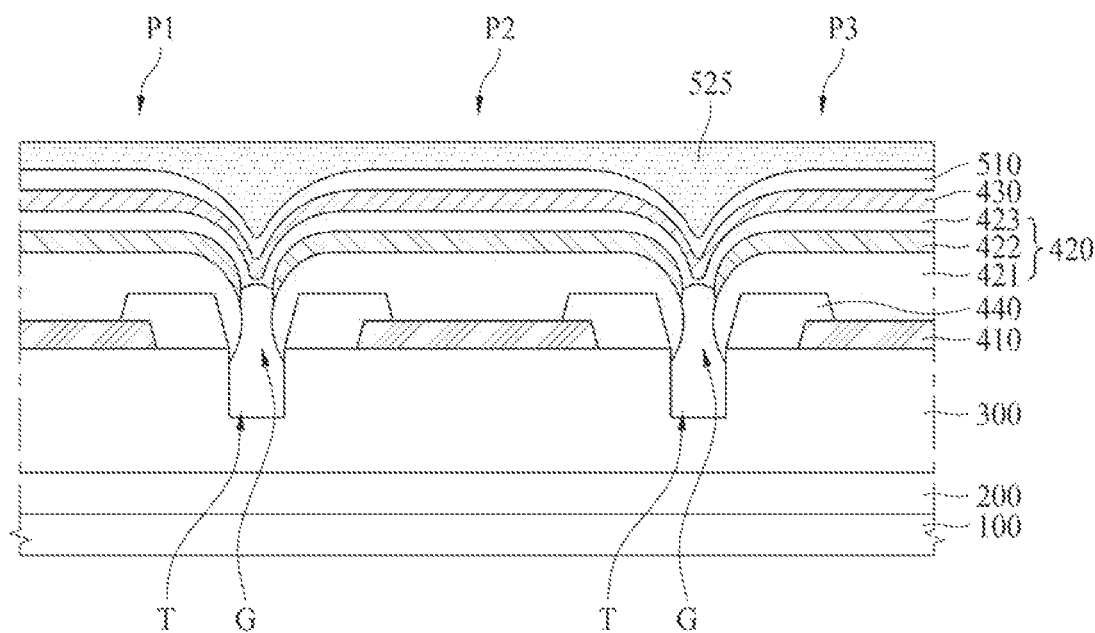

Referring to FIG. 3D, a light absorbing material 525 is coated on the first encapsulation layer 510. The light absorbing material 525 can be coated to a thickness of 200 nm or more and 500 nm or less to fill the concave region of the first encapsulation layer 520. In addition, the light absorbing material 525 can be a material that can be cured at a low temperature and can be dry etched. For example, the light absorbing material 525 can include an inorganic material such as an epoxy-based compound or an acrylic compound.

A portion of the coated light absorbing material 525 can be removed through an ashing process. Specifically, since the light absorbing material 525 starts to be removed from an upper portion thereof, a portion of an upper surface of the first encapsulation layer 510 can be exposed. Accordingly, the light absorbing material 525 that has not been removed and the exposed upper surface of the first encapsulation layer 510 can be formed to be flat. Alternatively, when the ashing process is performed even after the light absorbing material 525 and the upper surface of the first encapsulation layer 510 have a flat shape, a portion of the light absorbing material 525 can be further etched and the exposed upper surface of the first encapsulation layer 510 can have a structure that protrudes from the upper surface of the light absorbing material 525. In addition, in the ashing process, oxygen can be used to prevent damage to the light absorbing material 525.

Figure 3E:
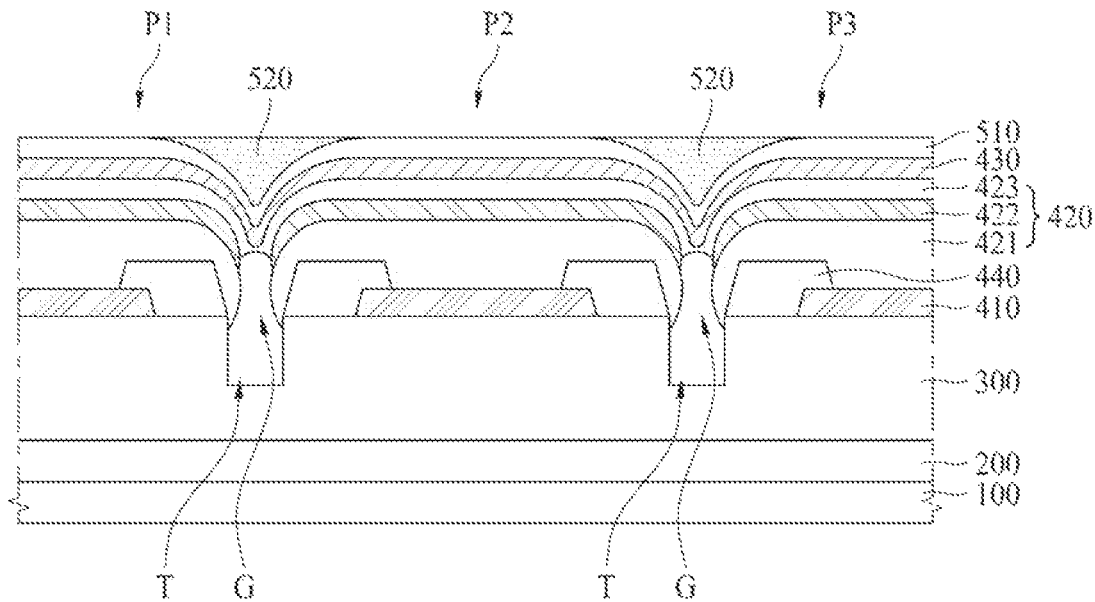

Through the above process, referring to FIG. 3E, the light absorption layer 520 can be formed on the first encapsulation layer 510. The light absorption layer 520 is formed on the upper surface of the first encapsulation layer 510 in the region overlapping the trench T, and is formed to fill the concave region of the first encapsulation layer 510. Accordingly, a step difference due to the trench T can be compensated for by the light absorption layer 520 so that upper surfaces of the first encapsulation layer 510 and the light absorption layer 520 can be formed to be flat. Alternatively, the upper surface of the first encapsulation layer 510 can have a structure that protrudes from the upper surface of the light absorption layer 520.

Figure 3F:
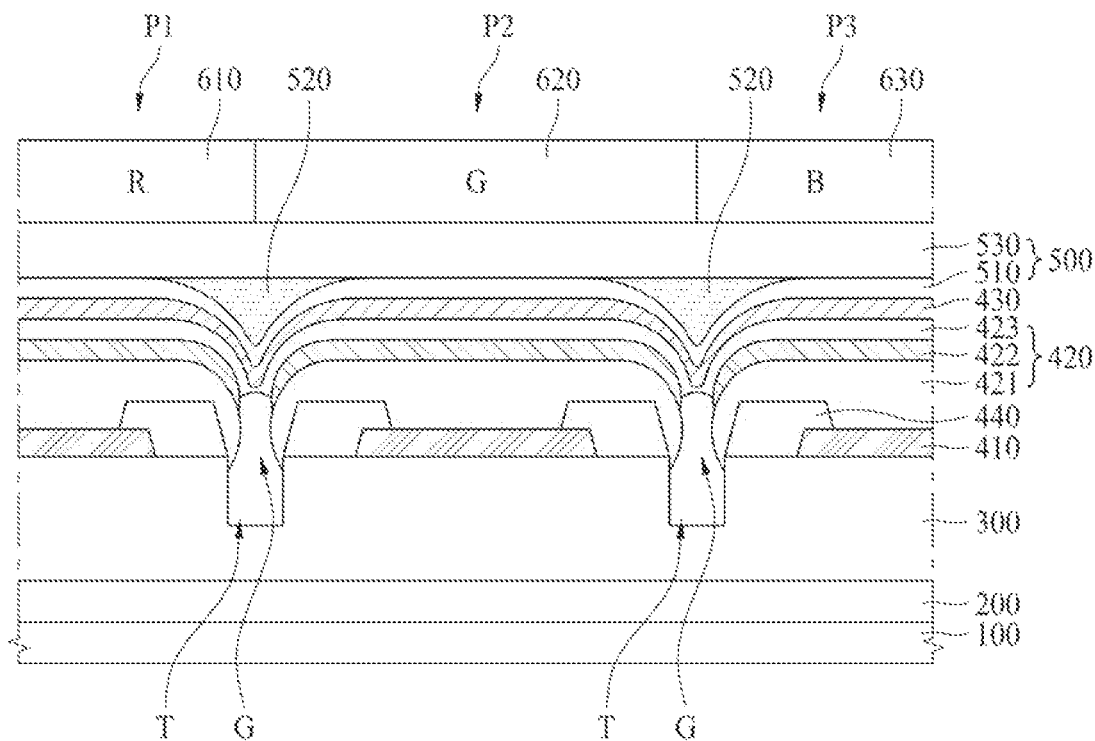

Referring to FIG. 3F, the second encapsulation layer 530 is formed on the first encapsulation layer 510 and the light absorption layer 520, and the color filters 610, 620, and 630 are formed on the second encapsulation layer 530.

As shown in FIG. 3F, since the upper surfaces of the first encapsulation layer 510 and the light absorption layer 520 are formed to be flat, the second encapsulation layer 530 does not have a step difference and can be stably formed. In addition, as described above, since the uppermost surface of the first encapsulation layer 510 and the light absorption layer 520 are formed of an inorganic material, the lower surface of the second encapsulation layer 530 can include an inorganic material such as silicon nitride or aluminum oxide to strength adhesion between the first encapsulation layer 510 and the light absorption layer 520 and the second encapsulation layer 530.

Figure 4:
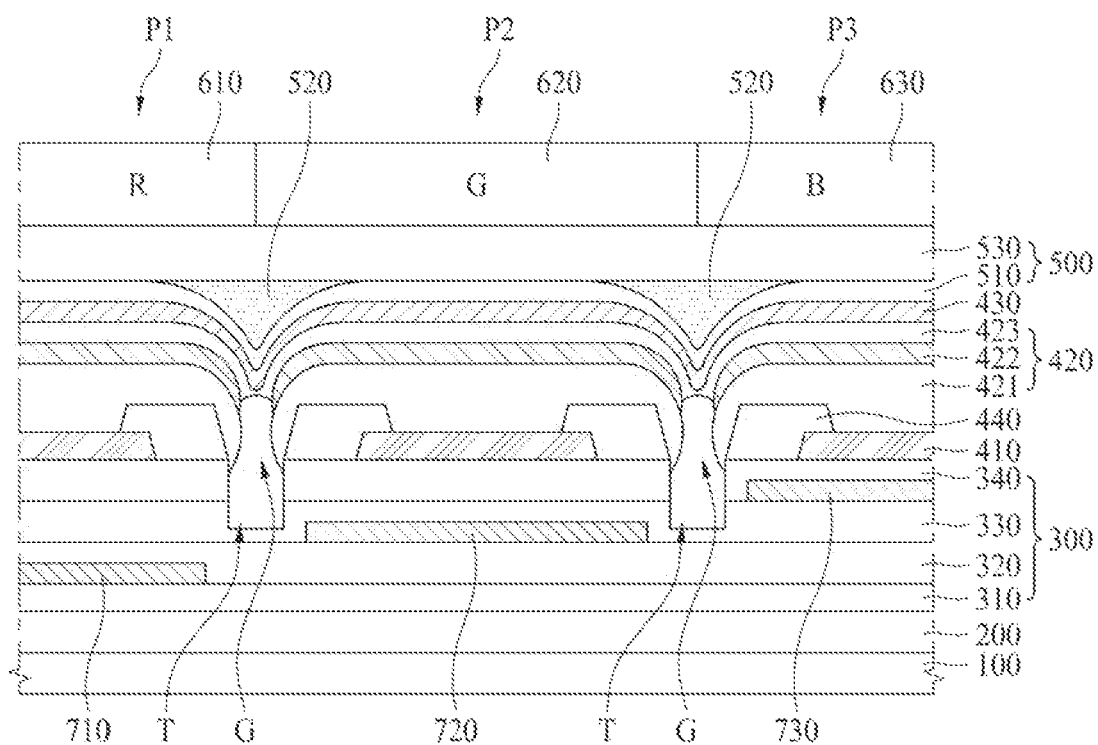
FIG. 4 is a cross-sectional view illustrating another example of a display apparatus according to the present disclosure.

FIG. 4 is a cross-sectional view illustrating another example of a display apparatus according to the present disclosure.

Referring to FIG. 4, the insulating layer 300 can include first to fourth insulating layers 310, 320, 330, and 340. A first reflective electrode 710 can be provided on an upper surface of the first insulating layer 310 in the first subpixel region P1, a second reflective electrode 720 can be provided on an upper surface of the second insulating layer 320 in the second subpixel region P2, a third reflective electrode 730 can be provided on an upper surface of the third insulating layer 330 in the third subpixel region P3. Also, the fourth insulating layer 340 can be formed to cover the third reflective electrode 730.

The first to third reflective electrodes 710, 720, and 730 are formed of silver (Ag) or a metal material containing silver (Ag), and emit light emitted from the light emitting layer 420 in a direction of the second electrode 430.

Further, a distance between the first reflective electrode 710 and the second electrode 430 can be greater than a distance between the second reflective electrode 720 and the second electrode 430, and a distance between the second reflective electrode 720 and the second electrode 430 can be greater than a distance between the third reflective electrode 730 and the second electrode 430. As described above, by forming different distances between the first to third reflective electrodes 710, 720, and 730 and the second electrode 430, light of different colors can be extracted using microcavity characteristics.

Specifically, as the distance between the first to third reflective electrodes 710, 720, and 730 and the second electrode 430 increases, long-wavelength light extraction efficiency can be improved, so that light extraction efficiency of red light between the first reflective electrode 710 and the second electrode 430 can be improved, and also, as the distance between the first to third reflective electrodes 710, 720, and 730 and the second electrode 430 decreases, short-wavelength light extraction efficiency can be improved, so that light extraction efficiency of blue light between the third reflective electrode 730 and the second electrode 430 can be improved. In addition, since the distance between the second reflective electrode 720 and the second electrode 430 is shorter than the distance between the first reflective electrode 710 and the second electrode 430 and longer than the distance between the third reflective electrode 730 and the second electrode 430, light extraction efficiency of green light can be improved.

Accordingly, light extraction efficiency of red light is improved to emit red light in the first subpixel P1, the light extraction efficiency of green light is improved to emit green light in the second subpixel P2, and light extraction efficiency of blue light is improved to emit blue light in the third subpixel P3.

Figure 5:
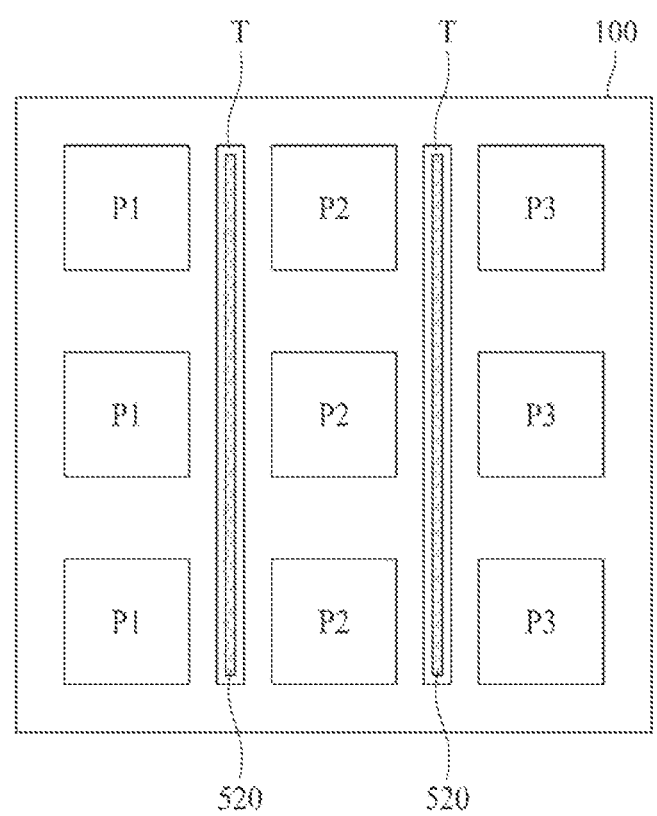
FIG. 5 is a plan view illustrating another example of a display apparatus according to the present disclosure.

FIG. 5 is a plan view illustrating another example of a display apparatus according to the present disclosure.

Referring to FIG. 5, the first subpixel P1, the second subpixel P2, and the third subpixel P3 are sequentially arranged in a first direction, e.g., a horizontal direction, a plurality of first subpixels P1 emitting light of the same color are arranged in a second direction, e.g., a vertical direction, a plurality of second subpixels P2 emitting light of the same color are also arranged in the second direction, and a plurality of third subpixels P3 emitting light of the same color can also be arranged in the second direction.

The trench T can extend from a first side of the substrate 100, e.g., a lower side, to a second side, e.g., an upper side, in the second direction along the boundary region between the first subpixel P1 and the second subpixel P2 and the boundary region between the second subpixel P2 and the third subpixel P3. Accordingly, the trench T can be formed in a stripe structure as a whole.

The light absorption layer 520 can be provided in a region overlapping the trench T and can absorb light. Also, the light absorption layer 520 can be formed in the same shape as the trench T. For example, the light absorption layer 520 can extend from the first side of the substrate 100, e.g., the lower side, to the second side, e.g., the upper side, in the second direction along the boundary region between the first subpixel P1 and the second subpixel P2 and the boundary region between the second subpixel P2 and the third subpixel P3. Accordingly, the light absorption layer 520 can be formed in a stripe structure as a whole. In addition, a width of the light absorption layer 520 can be larger or smaller than a width of the trench T, but does not extend to a region in which the plurality of subpixels P1 to P3 is provided.

However, the trench T and the light absorption layer 520 are not formed in a boundary region between the plurality of first subpixels P1 emitting light of the same color, in a boundary region between the plurality of second subpixels P2 emitting light of the same color, and a boundary region between the plurality of third subpixels P3 emitting light of the same color.

Accordingly, electric charges can be transferred between two adjacent first subpixels P1, between two adjacent second subpixels P2, and between two adjacent third subpixels P3, but since electric charges are transferred between the subpixels P1 to P3 emitting light of the same color, there is no problem in image quality.

Figure 6:
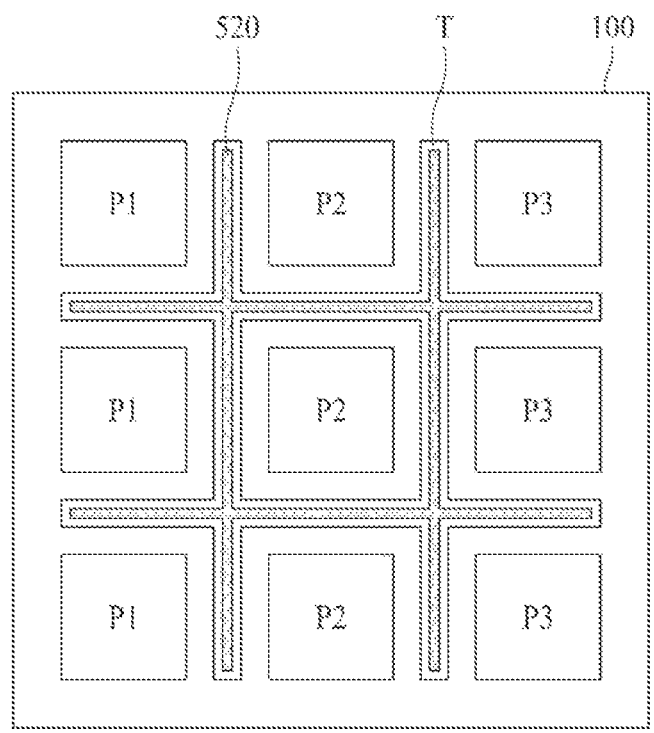
FIG. 6 is a plan view illustrating another example of a display apparatus according to the present disclosure.

FIG. 6 is a plan view illustrating another example of a display apparatus according to the present disclosure.

Referring to FIG. 6, in the structure of FIG. 5, the trench T and the light absorption layer 520 are additionally formed in a boundary region between the plurality of first subpixels P1 emitting light of the same color, the boundary region between the plurality of second subpixels P2 emitting light of the same color, and the boundary region between a plurality of third subpixels P3 emitting light of the same color.

According to FIG. 6, the trench T extends from the first side of the substrate 100 to the second side of the substrate 100 in the second direction, e.g., in the vertical direction, along the boundary region between the plurality of subpixels P1 to P3 emitting light of different colors and extend from the third side of the substrate 100 to the fourth side of the substrate in the first direction, e.g., in the horizontal direction along the boundary region between the plurality of subpixels P1 to P3 emitting light of the same color.

The light absorption layer 520 can also extend along the direction in which the trench T extends. For example, the light absorption layer 520 extends from the first side of the substrate 100 to the second side of the substrate 100 in the second direction, e.g., in the vertical direction, along the boundary region between the plurality of subpixels P1 to P3 emitting light of different colors and extend from the third side of the substrate 100 to the fourth side of the substrate in the first direction, e.g., in the horizontal direction along the boundary region between the plurality of subpixels P1 to P3 emitting light of the same color. In addition, a width of the light absorption layer 520 can be larger or smaller than a width of the trench T, but the light absorption layer 520 does not extend to a region in which the plurality of subpixels P1 to P3 are provided.

Accordingly, the trench T and the light absorption layer 520 can be formed in all boundary regions between the plurality of subpixels P1 to P3 and can be formed in a mesh structure as a whole.

Figure 7A:
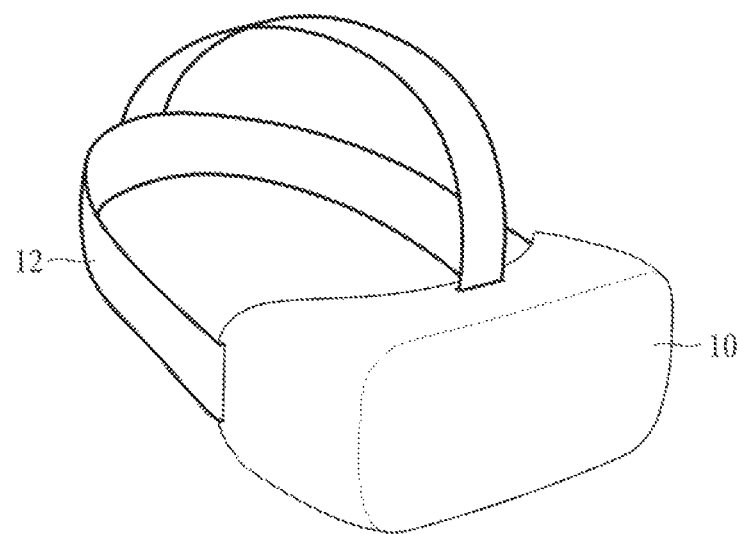
FIGS. 7A to 7C relate to a display apparatus according to an embodiment of the present disclosure, which relates to a head mounted display (HMD) apparatus.
Figure 7B:
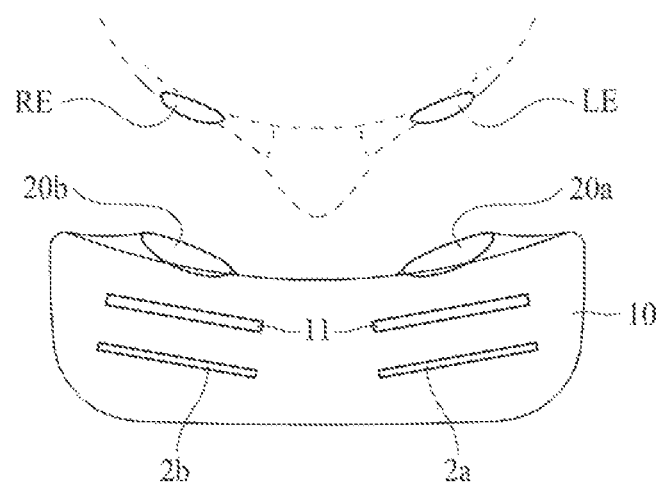
Figure 7C:
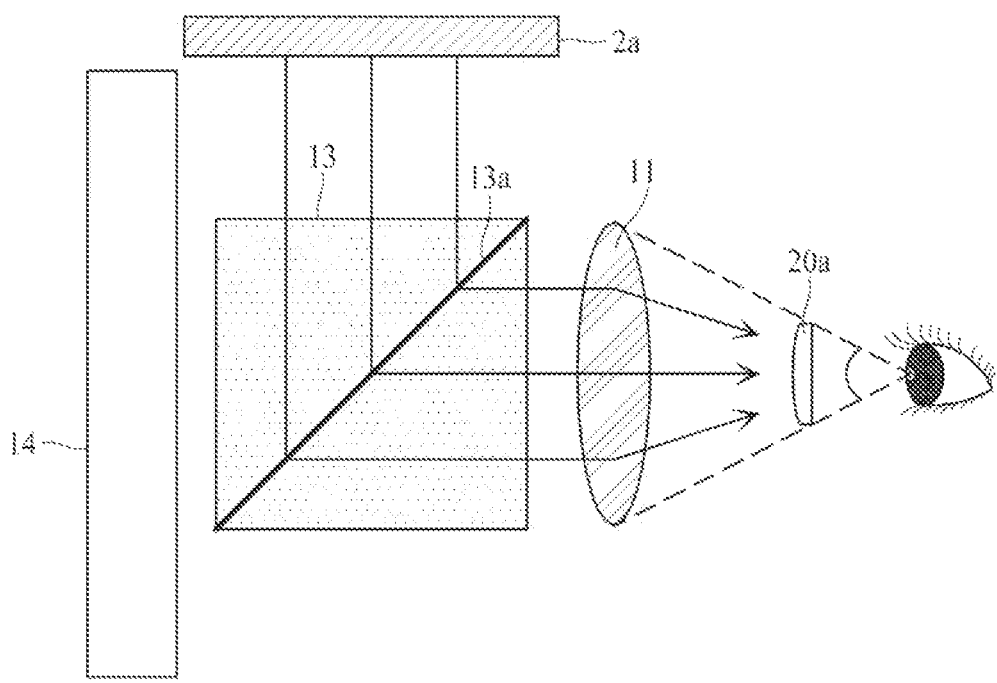

FIGS. 7A to 7C relate to a display apparatus according to another embodiment of the present application, which relates to a head mounted display (HMD) apparatus.

Referring to FIG. 7A, the HMD apparatus includes a storage case 10 and a head mounted band 12.

The storage case 10 houses a display apparatus, a lens array, and an eyepiece therein. The head mounted band 12 is fixed to the storage case 10.

The head mounted band 12 is shown to be formed to surround an upper surface and both side surfaces of the user's head, but is not limited thereto. The head mounted band 12 is for fixing the HMD to the user's head, and can be replaced with a structure in the form of glasses frame or helmet.

Referring to FIG. 7B, the HMD apparatus having a virtual reality (VR) structure according to the present disclosure can include a left-eye display apparatus 2a and a right-eye display apparatus 2b, a lens array 11, and a left eyepiece 20a for a left eye (LE) and a right eyepiece 20b for a right eye (RE).

The left-eye display apparatus 2a and the right-eye display apparatus 2b, the lens array 11, and the left eyepiece 20a and the right eyepiece 20b are accommodated in the storage case 10 described above.

The left-eye display apparatus 2a and the right-eye display apparatus 2b can display the same image, and in this case, the user can view a 2D image. Alternatively, the left-eye display apparatus 2a can display a left-eye image and the right-eye display apparatus 2b can display a right-eye image. In this case, the user can view a stereoscopic image. Each of the left-eye display apparatus 2a and the right-eye display apparatus 2b can include the display apparatus described above. For example, each of the left-eye display apparatus 2a and the right-eye display apparatus 2b can be an organic light emitting display.

Each of the left-eye display apparatus 2a and the right-eye display apparatus 2b can include a plurality of subpixels, a circuit element layer 200, an insulating layer 300, a first electrode 410, a light emitting layer 420, and a second electrode 430 and display various images by combining colors of light emitted from each subpixel in various ways.

The lens array 11 can be provided between the left eyepiece 20a and the left eye display apparatus 2a and can be spaced apart from each of the left eyepiece 20a and the left eye display apparatus 2a. For example, the lens array 11 can be located in front of the left-eye eyepiece 20a and behind the left-eye display apparatus 2a. In addition, the lens array 11 can be provided between the right eyepiece 20b and the right eye display apparatus 2b, while being spaced apart from each of the right eyepiece 20b and the right eye display apparatus 2b. For example, the lens array 11 can be positioned in front of the right-eye eyepiece 20b and behind the right eye display apparatus 2b.

The lens array 11 can be a micro lens array. The lens array 11 can be replaced with a pin hole array. Due to the lens array 11, an image displayed on the left-eye display apparatus 2a or the right-eye display apparatus 2b can be enlarged to be seen by the user.

The user's left eye LE can be located in the left eyepiece 20a, and the user's right eye RE can be located in the right eyepiece 20b.

Referring to FIG. 7C, the HMD apparatus having an augmented reality (AR) structure according to the present disclosure includes a left-eye display apparatus 2a, a lens array 11, a left-eye eyepiece 20a, a transmissive reflector 13, and a transmissive window 14. FIG. 7C shows only a left eye configuration for convenience, and a right eye configuration is also the same as the left eye configuration.

The left eye display apparatus 2a, the lens array 11, the left-eye eyepiece 20a, the transmissive reflector 13, and the transmissive window 14 are accommodated in the storage case 10 described above.

The left-eye display apparatus 2a can be disposed on one side, e.g., on an upper side, of the transmissive reflector 13 without blocking the transmissive window 14. Accordingly, the left-eye display apparatus 2a can provide an image to the transmissive reflector 13 without blocking an external background viewed through the transmissive window 14.

The left-eye display apparatus 2a can include the display apparatus described above. Here, an upper portion corresponding to a surface on which an image is displayed faces the transmissive reflector 13.

The lens array 11 can be provided between the left-eye eyepiece 20a and the transmissive reflector 13. The left eye of the user is located in the left-eye eyepiece 20a.

The transmissive reflector 13 is disposed between the lens array 11 and the transmissive window 14. The transmissive reflector 13 can include a reflective surface 13a that transmits a portion of light and reflects another portion of the light. The reflective surface 13a is formed so that an image displayed on the left-eye display apparatus 2a moves to the lens array 11. Accordingly, the user can view both an external background and the image displayed by the left-eye display apparatus 2a through the transmissive window 14. For example, since the user can view a single image by overlapping a real background and a virtual image, augmented reality (AR) can be implemented.

The transmissive window 14 is disposed in front of the transmissive reflector 13.

According to the present disclosure, the light absorption layer is formed inside the encapsulation layer in the region overlapping the trench, thereby stably providing the encapsulation layer and preventing color mixing between adjacent subpixels.

The above-described feature, structure, and effect of the present disclosure are included in at least one embodiment of the present disclosure, but are not limited to only one embodiment. Furthermore, the feature, structure, and effect described in at least one embodiment of the present disclosure can be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
   a substrate including a plurality of subpixels including a first subpixel and a second subpixel;
   an insulating layer including a trench on the substrate;
   a first electrode provided in each of the first and second subpixels on the insulating layer;
   a light emitting layer provided on the insulating layer and the first electrode;
   a second electrode provided on the light emitting layer;
   an encapsulation layer provided on the second electrode; and
   a light absorption layer provided in a region overlapping the trench,
   wherein the trench and the light absorption layer are provided in a boundary region between the first subpixel and the second subpixel,
   wherein a portion of the light emitting layer is disconnected inside the trench,
   wherein the light emitting layer includes:
   a first stack provided on the insulating layer;
   a charge generating layer provided on the first stack; and
   a second stack provided on the charge generating layer, and
   wherein the first stack and the charge generating layer are disconnected in the trench.

2. The display apparatus of claim 1, wherein the encapsulation layer includes:
   a first encapsulation layer provided on the second electrode; and
   a second encapsulation layer provided on the first encapsulation layer,
   wherein the light absorption layer is provided between the first encapsulation layer and the second encapsulation layer.

3. The display apparatus of claim 2, wherein
   the first encapsulation layer has a concave shape in a region overlapping the trench, and
   the light absorption layer fills the region of the first encapsulation layer.

4. The display apparatus of claim 3, wherein upper surfaces of the first encapsulation layer and the light absorption layer are flat.

5. The display apparatus of claim 2, wherein the first encapsulation layer is in contact with the second encapsulation layer in a region overlapping the first electrode.

6. The display apparatus of claim 1, wherein at least a portion of the second stack is disconnected and at least a portion of the second stack is continuous.

7. The display apparatus of claim 6, wherein
   the second stack includes a second hole transport layer, a second organic light emitting layer, a second electron transport layer, and an electron injection layer being sequentially stacked,
   the second hole transport layer, the second organic light emitting layer, and the second electron transport layer are disconnected, and
   the electron injection layer is continuous.

8. The display apparatus of claim 1, further comprising:
a bank covering an end of the first electrode,
wherein one end of the bank is in contact with an entrance of the trench.

9. The display apparatus of claim 1, further comprising:
a first color filter provided in the first subpixel; and
a second color filter provided in the second subpixel,
wherein the light absorption layer is provided in a boundary region of the first color filter and the second color filter.

10. The display apparatus of claim 1, wherein
the plurality of subpixels further include a third subpixel, and
a first reflective electrode, a second reflective electrode and a third reflective electrodes are further provided inside the insulating layer.

11. The display apparatus of claim 10, wherein
the insulating layer is formed by sequentially stacking a first insulating layer, a second insulating layer, and a third insulating layer on a circuit element layer,
the first reflective electrode is provided on the first insulating layer in a region having the first subpixel,
the second reflective electrode is provided on the second insulating layer in a region having the second subpixel, and
the third reflective electrode is provided on the third insulating layer in a region having the third subpixel.

12. The display apparatus of claim 1, wherein
the first and second subpixels are arranged in a first direction,
the plurality of subpixels additionally include another first subpixel adjacent to the first subpixel in a second direction and configured to emit light of a same color, and another second subpixel adjacent to the second subpixel in the second direction and configured to emit light of a same color, and
the trench is additionally provided in a boundary region between the another first subpixel and the another second subpixel and extends from a first side of the substrate to a second side of the substrate.

13. The display apparatus of claim 12, wherein the light absorption layer is additionally provided in a boundary region between the another first subpixel and the another second subpixel, and from the first side of the substrate to the second side of the substrate.

14. The display apparatus of claim 12, wherein the trench is additionally provided in a boundary region between the first subpixel and the another first subpixel and in a boundary region between the second subpixel and the another second subpixel, and extends from a third side of the substrate to a fourth side of the substrate.

15. The display apparatus of claim 14, wherein the light absorption layer is additionally provided in a boundary region between the first subpixel and the another first subpixel and in a boundary region between the second subpixel and the another second subpixel, and extends from the third side of the substrate to the fourth side of the substrate.

* * * * *